United States Patent [19]

Montminy et al.

[11] 4,312,015
[45] Jan. 19, 1982

[54] AUTOMATIC MRT SYSTEM

[75] Inventors: Joseph G. B. Montminy, Quebec; Paul C. Chevrette, Neufchatel, both of Canada

[73] Assignee: Her Majesty the Queen in right of Canada, as represented by the Minister of National Defence, Ottawa, Canada

[21] Appl. No.: 156,026

[22] Filed: Jun. 3, 1980

[30] Foreign Application Priority Data

Jul. 27, 1979 [CA] Canada ................................. 332644

[51] Int. Cl.³ ................................................. H04N 9/04
[52] U.S. Cl. ..................................... 358/139; 364/525; 364/553
[58] Field of Search ................. 338/139; 364/515, 553, 364/525

[56] References Cited
U.S. PATENT DOCUMENTS

| | | | |
|---|---|---|---|
| 3,008,001 | 11/1961 | Reith | 358/139 |
| 3,357,230 | 12/1969 | Topaz | 358/139 |
| 3,525,571 | 8/1970 | Gebel | 364/525 |
| 3,894,862 | 10/1976 | Volz | 358/139 |
| 3,973,112 | 8/1976 | Sloane | 364/553 |
| 4,081,858 | 3/1978 | Koblasz et al. | 364/553 |
| 4,234,890 | 11/1980 | Astle et al. | 358/139 |

*Primary Examiner*—Robert L. Richardson
*Assistant Examiner*—Edward L. Coles
*Attorney, Agent, or Firm*—Larson and Taylor

[57] ABSTRACT

A testing system for measuring and evaluating the performance of electro-optical systems. The system under test is operated with the optics and electronics functioning in its normal manner. To simulate the type of signal produced by a test object under normal conditions an ideal bar signal is modified to represent normal signal degradation in the components in accordance with the previously measured impulse response of the electro-optical system. This degraded signal is then added at a particular point in the electro-optical system. The simulated signal can be varied in a controlled manner and observer responses noted.

6 Claims, 2 Drawing Figures

AUTOMATIC MRT SYSTEM

BACKGROUND OF THE INVENTION

This invention relates to an apparatus and method for testing electro-optical systems under conditions which closely simulate that of real use.

In testing electro-optical systems it is customary to determine the response to a bar pattern. As discussed in "Perception of Displayed Information" (Biberman, Plenum Press, New York, 1973) operator response to such bar patterns is closely related to operator response when tracking real targets. Reference may be made to chapter 5 with particular reference to pages 224 and 225 where the correlation between "real world" objects and "equivalent bar pattern" objects is discussed.

In the testing of thermal imaging systems it has been the practice to place a bar pattern array in front of a variable temperature background in the field of the view of the system under test. The temperature difference between the bar pattern and the background is reduced until the observer can just no longer distinguish the bar pattern from the background. A curve of minimum resolvable temperature difference (MRTD) versus spatial frequency can thus be generated with observed MRTD points for different bar pattern sizes corresponding to different spatial frequencies. This method is slow and difficult to implement mainly due to the difficulties in providing suitable bar pattern sources.

An improved method, called the injection technique overcomes some of these difficulties. In this method, an electronic 4-bar pattern signal is injected at the input of the video amplifier of the system under test. The injected bar pattern signal is a sine wave gated by the synchronization signals of the imaging system. The minimum resolvable voltage (MRV) is first found and the MRTD is derived according to the following equation:

$$MRTD = \frac{MRV}{4\,MTF\,(\Delta V/\Delta T)}$$

where MTF is the modulation transfer function of the system up to the injecton point, and $\Delta V/\Delta T$ is the low frequency responsivity in Volt/° C. The $\pi/4$ factor is the ratio between the sine wave signal amplitude and that of the equivalent square wave signal.

This method has two drawbacks. It is not valid at low frequencies where the higher harmonics of the square wave are not taken into account. Further, it completely neglects phase effects as well as the fact that the 4-bar pattern is a truncated signal in both dimensions. To allow an exact replacement of the earlier method by the improved method, the injected 4-bar pattern should be degraded according to the optical transfer function (OTF), which includes phase effects, in both dimensions, prior to injection.

SUMMARY OF THE INVENTION

The present application relates to an advance on this last-mentioned system in that signals simulating a 4-bar pattern are produced which are degraded in accordance with the optical transfer function of the system under measurement. These degraded signals are injected electronically in the normal signal path of the apparatus under test to simulate real 4-bar patterns as they would appear through the complete optical portion of the system under test. The requirement for a precisely temperature controlled blackbody source with a 4-bar pattern target plate and a wide field of view collimator is eliminated.

Thus, the present invention relates to testing equipment for a system having a first set of optical components and signal processing circuits supplying a raster-type display and display driver circuits for the display. The testing equipment provides a signal simulating a test object. The equipment stores a transfer function representative of the impulse response of the first set of optical components and signal processing circuits. Means are provided to modify the signal by the transfer function. A further signal is provided representative of background radiation. The modified signal and the background signal are summed and injected into the system at the output of the first set of optical components and signal processing circuits.

In its method aspect, the invention relates to a method of testing an electro-optical system having a raster-type display, comprising the steps of: determining the impulse response of the system at a test point located along the signal processing chain, simulating a response signal to a test object, modifying the simulated signal by the impulse response, simulating a signal representative of background radiation, and summing the modified signal and the background signal and supplying the summed signal to the test point whereby the summed signal is added to noise from the system.

DESCRIPTION OF THE PREFERRED EMBODIMENT

Figure 1:
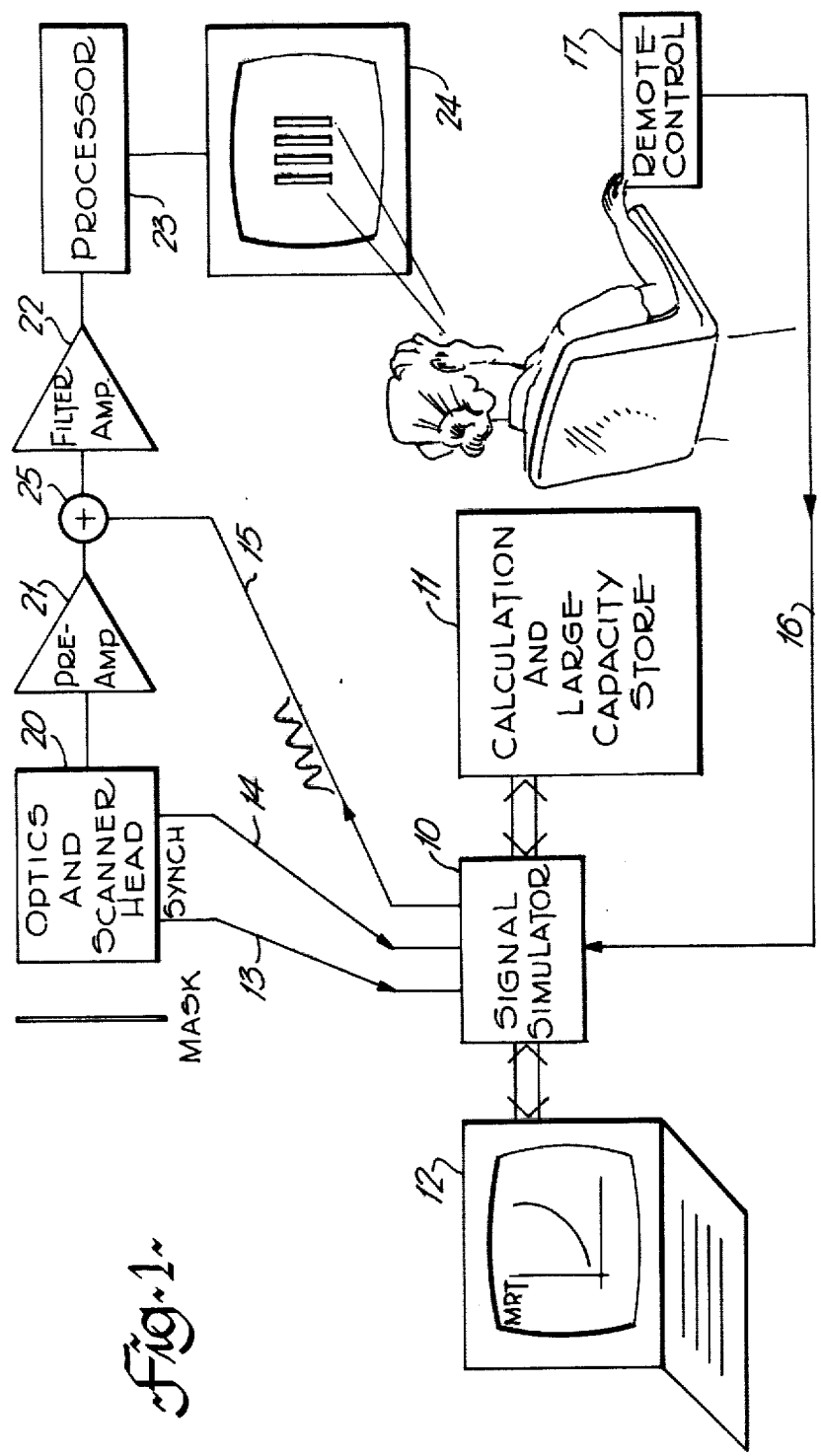
FIG. 1 is a general view of the system of this invention operating in conjunction with an electro-optical system under test.

FIG. 1 shows how the apparatus of the present invention is used in conjunction with the electro-optical system under test. Elements 20, 21, 22, 23 and 24 are all portions of the system being tested. Specifically, element 20 represents the optics and scanning head of the system under test, element 21 is the preamplifier, element 22 is a filter amplifier, element 23 is the data processor and element 24 the video display. Between elements 21 and 22 a summing stage 25 is included so that simulated signals from the test equipment may be injected. These test signals are supplied from a signal simulator 10. Preferably simulator 10 operates in conjunction with a computer 11 having a large capacity store. Control console 12 and remote control unit 17 are provided for controlling testing process and recording results.

Elements 20, 21, 22, 23 and 24 are tested in their normal operating condition, generating noise and other random effects as during system operation. Conductors 13 and 14 transmit the normal system synchronization signals from element 20 to signal simulator 10 and conductor 15 transmits the simulated test object signal from signal simulator 10 to summing stage 25 at the input of filter amplifier 22.

Control console 12 performs several monitoring and recording functions. It varies the characteristics of the simulated signal on conductor 15 as to intensity and difference from background. Conductor 16 from remote control unit 17 to signal simulator 10 is used to monitor and record the levels at which an observer seated in front of the screen of display unit 24 indicates perception of minimim differences.

Figure 2:
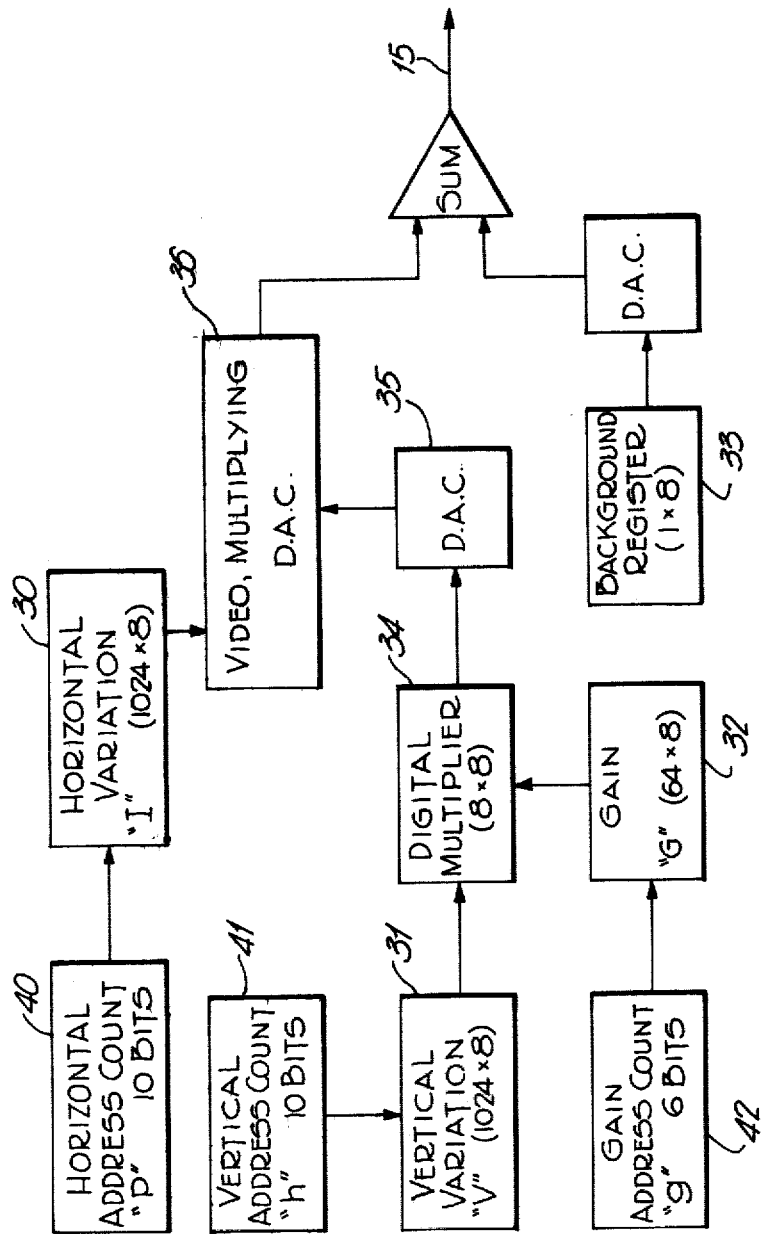
FIG. 2 is a schematic diagram of the signal simulator of this invention.

FIG. 2 shows a schematic diagram of one embodiment of the signal simulating circuit 10. The degraded bar pattern is formed from two vectors; one describing the degraded bar pattern in the horizontal direction and the other describing the degraded truncation function in the vertical direction. These vectors are designated as "I" and "V" respectively. Two other variables are necessary to control the video signal such that the minimum resolvable voltage (MRV) function may be determined; these are the gain, "G" corresponding to the bar-to-background temperature differential, and the background intensity "B".

Circuit 10 includes four blocks of memory: Pattern Intensity Store 30 (I) is a block of 1024×8 bits. The degraded bar pattern in the horizontal direction is stored in this location. Vertical Variation Store 31 (V) is a block of 1024×8 bits that contains the degraded truncation function in the vertical direction. Gain Store 32 (G) is a block of 64×8 bits that contains a vector of up to 64 gain values corresponding to 64 possible bar-pattern-to-background temperature differences for a given spatial frequency. Background Store 33 (B) is a 1×8 bit memory that contains the digital DC value of the video signal. Thus 256 DC levels are possible.

The video data D is defined as:

$$D_{p,h} = B + G_g(I_p V_h)$$

where $D_{p,h}$ is a video matrix of 1024×1024 values,
B is the background or DC value,
$G_g$ is the gain vector,
$I_p$ is the pattern intensity vector, and
$V_h$ is the vertical variation vector.

Indexes are:
p = order of each point or element in a line (0 to 1023)
h = order of each line in a frame (0 to 1023)
g = order of each gain in the gain vector G The output D is obtained by first digitally multiplying the gain vector with the vertical variation vector in multiplier 34 and converting this product to an analog form in digital-to-analog converter 35. The product is then applied to the multiplying input of a multiplying digital-to-analog converter (DAC) 36. By feeding the pattern intensity vector to the digital input of DAC 36 and adding the background to its analog output, the degraded bar pattern to be fed to the system under evaluation is obtained.

In order to provide automatic operation of the system, address counters 40, 41 and 42 are provided to control selection of the data stored at particular locations in stores 30, 31 and 32, respectively. The data stored in horizontal and vertical stores 30 and 31 is obtained by a separate operation in computer 11 by convolution of ideal bar patterns with the impulse response of the thermal camera system up to injection point 25. The degraded signals can be transferred from the off-line computer to signal simulator 10 MRT system via normal modem I/O ports used for communicating with remote terminals.

The system can be selected to operate in three basic modes: An automatic mode, a timed automatic mode and a manual mode.

In the automatic mode the beginning of the actual spatial frequency presentation is indicated to the observer and the bar pattern is displayed with the first gain value. The observer then makes a decision by depressing a YES or NO push-button on the remote control unit 17 to indicate if he distinguishes the bars or not. Once the decision is made, the bar pattern is automatically displayed with the next gain value. The spatial frequency is changed when all the gain values have been displayed or when the observer depresses the STOP push-button. At each spatial frequency the gain values with the corresponding decisions are transferred to the computer.

In the timed automatic mode the bar pattern is displayed only for a period corresponding to the setting of the timer (0.1 to 60 s.). After that, the system waits for the decision of the observer.

In the manual mode the bar pattern is displayed with an observer-controlled gain value. The various decisions made by the observer can be temporarily stored in control console 12 and then transferred to computer 11 for subsequent analysis.

Thus, an apparatus and method for testing electro-optical equipment has been disclosed. In particular, the invention provides a novel circuit and method for simulating the signal occurring in the system under test including the effects of system degradation and noise.

We claim:

1. Testing equipment for a system having a first set of optical components and signal processing circuits supplying a raster-type display and display driver circuits for said display comprising:
   means providing a signal simulating a test object,
   means providing a transfer function representative of the impulse response of the first set of optical components and signal processing circuits,
   means modifying said signal by said transfer function,
   means providing a signal representation of background radiation, and
   means summing the modified signal and the background signal and injecting said summed signal into said system at the output of said first set of optical components and signal processing circuits.

2. The apparatus of claim 1 further including digital storage means for the values of said modified signal at discrete points on the raster.

3. The apparatus of claim 2 wherein said digital storage means includes a first digital store for horizontal scanning values of said modified signal and a second digital store for vertical truncation values of said modified signal.

4. The apparatus of claim 1 further including variable gain means for altering the relative intensities of the background signal and the modified signal.

5. A method of testing an electro-optical system having a raster-type display, comprising the steps of:
   determining the impulse response of the system at a test point located along the signal processing chain,
   simulating a response signal to a test object,
   modifying the simulated signal by the impulse response,
   simulating a signal representative of background radiation, and
   summing the modified signal and the background signal and supplying the summed signal to the test point whereby the summed signal is added to noise from the system.

6. The method of claim 5 wherein the modified signal is stored as discrete values corresponding to points on the raster.

* * * * *